United States Patent
Nemani et al.

(10) Patent No.: US 9,777,378 B2
(45) Date of Patent: Oct. 3, 2017

(54) ADVANCED PROCESS FLOW FOR HIGH QUALITY FCVD FILMS

(71) Applicant: Applied Materials, Inc., Santa Clara, CA (US)

(72) Inventors: Srinivas D. Nemani, Sunnyvale, CA (US); Erica Chen, Cupertino, CA (US); Ludovic Godet, Sunnyvale, CA (US); Jun Xue, San Jose, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 71 days.

(21) Appl. No.: 14/635,589

(22) Filed: Mar. 2, 2015

(65) Prior Publication Data

US 2016/0194758 A1    Jul. 7, 2016

Related U.S. Application Data

(60) Provisional application No. 62/100,888, filed on Jan. 7, 2015.

(51) Int. Cl.
   *C23C 16/56* (2006.01)
   *C23C 16/32* (2006.01)
   (Continued)

(52) U.S. Cl.
   CPC ............ *C23C 16/56* (2013.01); *C23C 16/045* (2013.01); *C23C 16/401* (2013.01)

(58) Field of Classification Search
   CPC ......... C23C 16/56; C23C 14/48; C23C 16/30; C23C 16/308
   See application file for complete search history.

(56) References Cited

U.S. PATENT DOCUMENTS 5,319,212 A * 6/1994 Tokoro ............... H01J 37/3171
                                                       250/397
7,867,923 B2    1/2011 Mallick et al.
(Continued)

FOREIGN PATENT DOCUMENTS

JP         2013516788 A    5/2013
KR    1020090040867 A    4/2009

OTHER PUBLICATIONS

International Search Report and Written Opinion for International Application No. PCT/US2015/065846 dated Mar. 31, 2016.

*Primary Examiner* — Dah-Wei D Yuan
*Assistant Examiner* — Kristen A Dagenais
(74) *Attorney, Agent, or Firm* — Patterson+Sheridan LLP

(57) ABSTRACT

Embodiments described herein relate to methods for forming flowable chemical vapor deposition (FCVD) films suitable for high aspect ratio gap fill applications. Various process flows described include ion implantation processes utilized to treat a deposited FCVD film to improve dielectric film density and material composition. Ion implantation processes, curing processes, and annealing processes may be utilized in various sequence combinations to form dielectric films having improved densities at temperatures within the thermal budget of device materials. Improved film quality characteristics include reduced film stress and reduced film shrinkage when compared to conventional FCVD film formation processes.

19 Claims, 4 Drawing Sheets

(51) Int. Cl.
　　　*C23C 14/48*　　(2006.01)
　　　*C23C 16/40*　　(2006.01)
　　　*C23C 16/04*　　(2006.01)

(56) References Cited

U.S. PATENT DOCUMENTS

| | | |
|---|---|---|
| 8,318,584 B2 | 11/2012 | Li et al. |
| 8,449,942 B2 | 5/2013 | Liang et al. |
| 8,557,712 B1 | 10/2013 | Antonelli et al. |
| 8,741,788 B2 | 6/2014 | Liang et al. |
| 2005/0191828 A1* | 9/2005 | Al-Bayati ......... H01J 37/32082 438/514 |
| 2012/0142192 A1* | 6/2012 | Li .................... H01L 21/02164 438/700 |
| 2014/0231384 A1 | 8/2014 | Underwood et al. |

\* cited by examiner

ADVANCED PROCESS FLOW FOR HIGH QUALITY FCVD FILMS

CROSS-REFERENCE TO RELATED APPLICATIONS

This application claims benefit of U.S. provisional patent application No. 62/100,888, filed Jan. 7, 2015, the entirety of which is hereby incorporated by reference.

BACKGROUND

Field

Embodiments of the present disclosure generally relate to a methods of forming dielectric materials on a substrate. More specifically, embodiments provided herein relate to process flow for forming high quality flowable chemical vapor deposition (FCVD) films.

Description of the Related Art

In semiconductor processing, devices are being manufactured with continually decreasing feature dimensions. Often, features utilized to manufacture devices at these advanced technology nodes include high aspect ratio structures and it is often necessary to fill gaps between the high aspect ratio structures with an insulating material. Examples where insulating materials are utilized for gap fill applications include shallow trench isolation, inter-metal dielectric layers, passivation layers, patterning applications, etc. As device geometries shrink and thermal budgets are reduced, void-free filling of high aspect ratio spaces becomes increasingly difficult due to limitations of existing deposition processes.

FCVD films may be utilized for high aspect ratio gap fill applications as the films exhibit good conformity, step coverage, and the ability to adequately fill high aspect ratio (HAR) spaces (HAR>10:1). However, FCVD films generally exhibit low density as deposited when compared to thermally deposited oxides. Moreover, high temperature annealing processes at temperatures greater than about 500 degrees Celsius, such as greater than about 1000 degrees Celsius, are often utilized in conventional FCVD processes to improve the film density. Such temperatures are often beyond the thermal budgets of device materials and may not be suitable for desired applications. In addition, high temperature annealing processes may cause film shrinkage and create undesirable tensile stress within the films which may result in device defects. Finally, conventional FCVD processes often suffer from queue time inefficiencies when a predominantly oxide containing dielectric film is desired.

Thus, there is a need for improved processes for forming FCVD films.

SUMMARY

In one embodiment, a method of forming a flowable CVD film is provided. The method includes forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr. The method sequentially includes treating the dielectric film by exposing the dielectric film to one or more ion species in an ion implantation process and subsequently exposing the dielectric film to oxygen radicals to cure the dielectric film. The cured dielectric film may be annealed by exposing the dielectric film to water vapor at a temperature less than about 500 degrees Celsius.

In another embodiment, a method of forming a flowable CVD film is provided. The method includes forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr. The formed dielectric film may be exposed to oxygen radicals to cure the dielectric film and the dielectric film may be subsequently treated by exposing the dielectric film to one or more ion species in an ion implantation process. The treated dielectric film may be annealed by exposing the dielectric film to water vapor at a temperature less than about 500 degrees Celsius.

In yet another embodiment, a method of forming a flowable CVD film is provided. The method includes forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr. The formed dielectric film may be exposed to oxygen radicals to cure the dielectric film and the dielectric film may be subsequently annealed by exposing the dielectric film to water vapor at a temperature less than about 500 degrees Celsius. The annealed dielectric film may be treated by exposing the dielectric film to one or more ion species in an ion implantation process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for forming flowable chemical vapor deposition (FCVD) films suitable for high aspect ratio gap fill applications, among other applications. Various process flows described include ion implantation processes utilized to treat a deposited FCVD film to improve dielectric film density and material composition. Ion implantation processes, curing processes, and annealing processes may be utilized in various sequence combinations to form dielectric films having improved densities at temperatures without exceeding the thermal budget of device materials. Improved film quality characteristics include reduced film stress and reduced film shrinkage when compared to conventional FCVD film formation processes.

Figure 1:
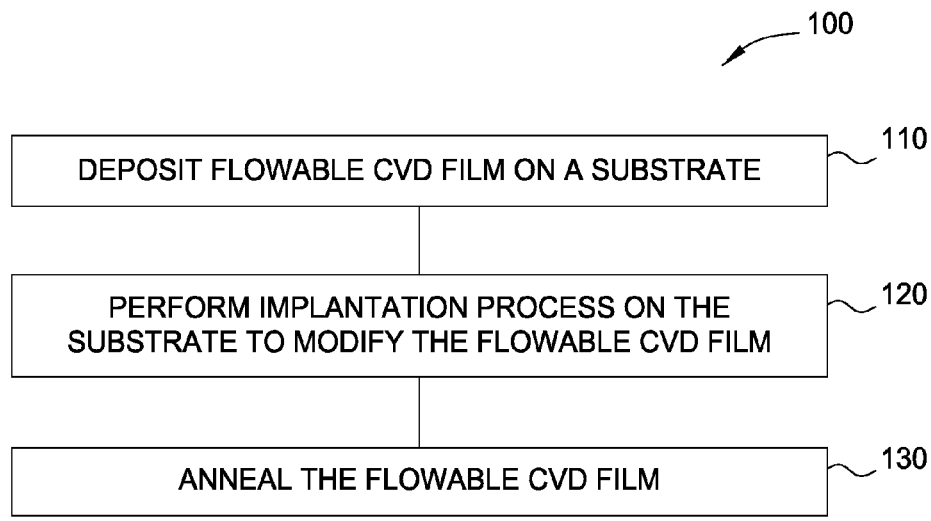
FIG. 1 illustrates operations of a method for forming an FCVD film according to one embodiment described herein.

FIG. 1 illustrates operations of a method 100 for forming an FCVD film. At operation 110, an FCVD film is deposited on a substrate. The substrate generally has HAR features formed thereon and one or more processing chambers may be utilized to deposit the FCVD film on the substrate. A flowable layer may be formed using a high-density plasma CVD system, a plasma enhanced CVD system, and/or a sub-atmospheric CVD system, among other systems. Examples of CVD systems that may be adapted to form a flowable oxide layer include the ULTIMA HDP CVD® system and PRODUCER® ETERNA CVD® system, both available from Applied Materials, Inc., of Santa Clara, Calif. It is contemplated that other suitable CVD systems from other manufacturers may also be utilized.

Deposited dielectric films are typically more flowable at lower plasma powers and shift from flowable to conformal when the plasma power is increased. For example, an argon containing plasma maintained in a processing region of a processing chamber may produce a more flowable silicon oxide layer as the plasma power is decreased from about 1000 Watts to about 100 Watts or lower (e.g., about 900, 800, 700, 600, or 500 Watts or less), and a more conformal layer as the plasma power is increased from about 1000 Watts or more (e.g., about 1000, 1100, 1200, 1300, 1400, 1500, 1600, 1700 Watts or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film.

One example of a process for forming an oxide layer over the substrate having high aspect ratio features formed thereon includes the reaction of a silicone containing precursor and an oxygen containing precursor at a temperature of about 100° C. or less to form a flowable oxide layer. Suitable silicon containing precursors include organosilicon precursors. Organosilicon precursors have a ratio of carbon atoms to silicon atoms less than 8. Suitable organosilicon compounds comprising the silicon containing precursor may have a ratio of oxygen to silicon atoms of 0 to about 6, and may include an Si—O—Si linkage that facilitates formation of $SiO_x$ films with reduced contamination from carbon and hydroxyl groups.

Suitable organosilicon compounds may be siloxane compounds, such as triethoxysiloxane, tetramethoxysiloxane, trimethoxysiloxane, hexamethoxydisiloxane, octamethoxytrisiloxane, and/or octamethoxydodecasiloxane, silazoxane compounds having one or more nitrogen groups, such as hexamethoxydisilazoxane, methyl hexamethoxydisilazoxane, chlorohexamethoxydisilazoxane, hexaethoxydisilazoxane, nonamethoxytrisilazoxane, and octamethoxycyclosilazoxane, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine, hexamethyldisilazane, silatrane, tetrakis(dimethylamino)silane, bis(diethylamino)silane, tris(dimethyl-amino)chlorosilane, and methylsilatrane. Suitable organosilicon compounds may also be disilanes, such as alkoxy disilanes, alkoxy-alkyl disilanes, and alkoxy-acetoxy disilanes, including compounds having the general structure:

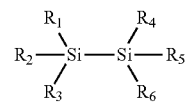

wherein $R_1$-$R_6$ may be, independently, a $C_{1-3}$ alkoxy group, a $C_{1-3}$ alkyl group, or an acetoxy group, wherein at least one of $R_{1-6}$ is an alkoxy group or an acetoxy group.

Suitable organosilicon compounds may also include cyclic disilanes with alkyl and alkoxy moieties, such as butasilanes, pentasilanes, hexasilanes, heptasilanes, octasilanes, and the like, having at least one alky and alkoxy group. Examples include octamethyl-1,4-dioxa-2,3,5,6-tetrasilacyclohexane; 1,4-dioxa-2,3,5,6-tetrasilzcyclohexane; and 1,2,3,4,5,6-hexamethoxy-1,2,3,4,5,6-hexamethylcyclohexasilane, among other alkoxyalkylcyclosilanes. Suitable organosilicon compounds also include organocyclosilanes such as cyclobutasilane, cyclopentasilane, cyclohexasilane, cycloheptasilane, cyclooctasilane, and other similar compounds.

The oxygen containing precursor may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors. The oxygen containing precursor may also include atomic oxygen and/or oxygen radicals that are generated remotely and introduced with the organosilicon precursor. A carrier gas, such as helium, neon, argon, and/or hydrogen may be mixed with the organosilicon precursor, the oxygen containing precursor, or both, if desired. The oxygen containing precursor may be activated prior to introduction to the processing chamber, for example using a remote plasma source, which may include thermal dissociation, ultraviolet light dissociation, RF, DC, and/or microwave dissociation. In one embodiment, 4-6 kW of RF power may be coupled into a flow of 900-1,800 sccm of argon and 600-1,200 sccm of molecular oxygen. The heating temperature may range between room temperature to about 1100° C.

The silicon containing precursor and the oxygen containing precursor are typically introduced to a processing chamber via different pathways to avoid reactions outside the processing chamber. The silicon containing precursor may be introduced as a gas to the processing chamber at a liquid-equivalent flow rate of about 800 mgm to about 1,600 mgm. Helium may be included as a carrier gas at a flow rate of about 600 sccm to about 2,400 sccm. An activated oxygen containing precursor may be introduced to the processing chamber at a flow rate between about 3 sLm and about 20 sLm. The precursors react to deposit a flowable oxide layer on a substrate having a patterned resist material. The flowable oxide flows to fill the recesses in the patterned substrate. In one embodiment, a flowable oxide layer, which may be silicon oxide, is deposited to a thickness of 200-400 Å to cover the features formed on the substrate and gaps between the features.

The silicon containing precursor, such as an organosilicon precursor, may be used to form a flowable layer at a processing temperature between about −10° C. and about 150° C., such as between about 30° C. and about 100° C., for example about 65° C., and pressure of about 0.5 Torr to about 10 Torr. The silicon containing precursor may be provided at a flow rate between about 10 sccm and about 1800 sccm, such as between about 600 sccm and about 1600 sccm, for example about 1400 sccm. The oxygen containing precursor may be provided at a flow rate between about 10 mgm and about 1,500 mgm, for example about 1,000 mgm.

A nitrogen containing precursor, such as a nitrogen-based radical precursor, may also be provided from a radical source at a flow rate between about 600 sccm and about 1,250 sccm, for example about 800 sccm. It is believed that flow rates at the higher values of the aforementioned ranges for both silyl gas and radical gas may improve flowability of the film and improve the mechanical strength of the deposited FCVD film. In some embodiments, the ratio of organo-silicon precursor flow rate to nitrogen-based radical flow rate may be from about 1:1 to about 10:1, for example about 2:1. The nitrogen-based radical gas may be derived from, for example, ammonia or other suitable nitrogen containing precursors.

In other embodiments, films may include, but are not limited to silicon-containing films. For example, a deposited FCVD film may be composed of SiC, SiO, SiCN, $SiO_2$, SiOC, SiOCN, SiON and/or SiN. The composition of the films depends on the composition of the precursor gases. SiC films may be deposited, for example, by using (dimethylsilyl)(trimethylsilyl)methane, hexamethyldisilane, and/or trimethylsilane. $SiO/SiO_2$ films may be deposited, for example, by using TEOS and/or disiloxane. SiCN films may be deposited, for example, by using tris(dimethylamino)silane, bis(dimethylamino)methylsilane, and/or (dimethylamino)dimethylsilane. SiOC films may be deposited, for example, by using tris(dimethylamino)silane, bis(dimethylamino)methylsilane, (dimethylamino)di-methylsilane, tris (dimethylamino)silane, bis(dimethylamino)methylsilane, and/or (dimethylamino)dimethylsilane. SiOCN films can be formed, for example, by using tris(dimethylamino)silane, bis(dimethylamino)methylsilane, and/or (dimethylamino) dimethylsilane. SiON films can be formed, for example, by using disiloxane or trisilylamine. SiN films may be deposited, for example, by using trisilylamine (TSA). Silane may also be a suitable precursor utilized in conjunction with one or more nitrogen containing precursors, such as those described above.

At operation 120, an implantation process may be performed on the substrate to modify the FCVD film deposited in operation 110. The implantation process generally incorporates ion species into the FCVD film to break existing unstable bonds that may exist in the FCVD film. The implantation process may be performed in-situ in the same processing chamber that performs the FCVD deposition process or ex-situ in a separate ion implantation chamber.

Figure 5:
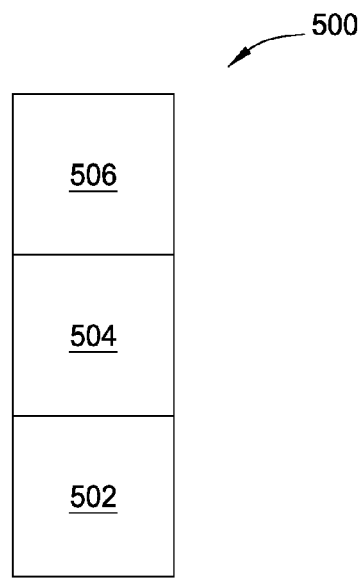
FIG. 5 schematically illustrates a processing apparatus utilized to form an FCVD film according to one embodiment described herein.

Referring now to FIG. 5, an in-situ implantation apparatus 500 is schematically illustrated. The apparatus 500 includes a load-lock chamber 502, a transfer chamber 504, and a processing chamber 506. The load-lock chamber 502 may be configured to receive a substrate from an atmospheric environment. The load-lock chamber 502 is configured to generate a vacuum environment prior to transferring the substrate to the transfer chamber 504 which is coupled to the load-lock chamber 502. The transfer chamber 504 may include a robot for transferring the substrate from the load-lock chamber 502 to the processing chamber 506. The processing chamber 506 may be any of the exemplary processing chambers described above and the processing chamber 506 may be configured with appropriate apparatus to perform an in-situ implantation process. For example, various precursors, in addition to those utilized to form the FCVD film, may be ionized and implanted within the FCVD film. Examples of suitable precursors include $BF_3$, $BI_3$, $N_2$, $PH_3$, $AsH_3$, $B_2H_6$, $H_2$, Ar, Xe, Kr, Ne, He, CHF3, C2F6, $CH_4$, $CF_4$, $CO_2$, $AsF_5$, Carborane, $PF_3$ and $PF_5$, among others. More specifically, species of ions may include He+, $H_3$+, $H_2$+, H+, Ne+, F+, C+, $CF_x$+, $CH_x$+, $C_xH_y$, N+, B+, $BF_2$+, $B_2H_x$+, Xe+ and molecular carbon, boron, or boron carbide ions. The implantation process may be performed during the FCVD film deposition process or subsequent to the FCVD film deposition process.

Figure 6:
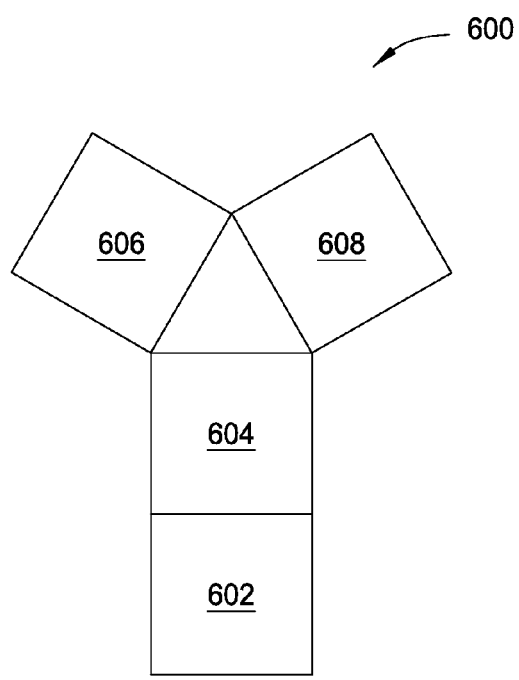
FIG. 6 schematically illustrates a processing apparatus utilized to form an FCVD film according to one embodiment described herein.

FIG. 6 schematically illustrates an ex-situ implantation apparatus 600. Similar to the apparatus 500, the apparatus 600 includes a load-lock chamber 602, a transfer chamber 604, and a processing chamber 606. The apparatus 600 also includes an ion implantation apparatus 608. After the FCVD film has been deposited on the substrate in the processing chamber 606, the substrate may be transferred from the processing chamber 606 through the transfer chamber 604 and positioned within the ion implantation apparatus 608. Examples of the ion implantation apparatus 608 include traditional ion implantation apparatuses, such as plasma immersion ion implantation apparatus and beamline ion implantation apparatus. One example of a plasma immersion ion implantation apparatus is the P3i system. Another example of a plasma ion implantation apparatus is the VARIAN VIISTA® PLAD™ system. One example of a beamline ion implantation apparatus is the VARIAN VIISTA® Trident, all available from Applied Materials, Inc. Santa Clara, Calif. It is contemplated that other similarly configured apparatus from other manufacturers may also be utilized to perform the embodiments described herein.

Various ion implantation characteristics may be configured to provide a desired implantation profile. For example, the ion species, ion concentration, ion implantation temperature, and implantation energy may be varied depending upon the desired application, for example, modifying the FCVD film utilized for shallow trench isolation. Suitable ion species may be generated from various precursor materials, such as hydrogen, helium, neon, argon, oxygen, nitrogen, silicon, phosphorous, boron, and arsenic containing materials, among others. Thermionic ion implantation may be performed at a temperature less than about 500 degrees Celsius, such as between about 200 degrees Celsius and about 400 degrees Celsius. Thermionic ion implantation may also be performed at lower temperatures, such as room temperature or the like. Ion concentration and implantation energy will generally be dependent upon the type of species being implanted and the desired dopant concentration within the FCVD film. In one example, H ions may be provided at a concentration between about 1E16 and about 1E20, such as about 1 E17, and implanted with an energy of between about 5 keV and about 10 keV, such as about 7.5 keV. It is contemplated that the ion implantation variables described above may be selected depending upon the desired FCVD film modification application.

An FCVD film containing unstable Si—H and Si—N bonds may be modified by incorporation of ions into the film. For example, oxygen ions may be implanted into the film to break the Si—H and Si—N bonds to initiate conversion of the FCVD film to an SiO$_2$ material. It is believed that H and N atoms dissociated from the Si atoms may be removed from the film as a result of outgassing in the form of NH, (i.e. NH$_3$). Resulting Si dangling bonds may bond with the implanted oxygen ions to form the SiO$_2$ material. Ion implantation of the FCVD film, depending upon the type of ion species selected, may also function to heal Si structures formed on the substrate. For example, FCVD film processes, such as curing and annealing, may damage the HAR structures and implantation of Si ion may function to heal the damages structures.

Referring back to FIG. 1, at operation 130 the FCVD film may be annealed. Annealing of the film may be performed either in the processing chamber (i.e. processing chamber 506 in in-situ embodiments), the ion implantation chamber (i.e. ion implantation apparatus 608 in ex-situ embodiments), or a different annealing apparatus, such as a rapid thermal processing chamber. Annealing the film further facilitates removal of the H and N atoms from the FCVD film via outgassing to form a predominantly SiO$_2$ material film. The annealing process may be performed at a temperature of less than about 500 degree Celsius for a suitable amount of time to provide for a desired degree of SiO$_2$ conversion. Water vapor may be provided during the annealing process to steam anneal the FCVD film. It is believed that oxygen atoms in the steam may advantageously be incorporated into the film by bonding to Si dangling bonds and increase the oxygen content of the SiO$_2$ material. It is contemplated that the steam annealing process may also prevent shrinkage of the SiO$_2$ material due to the availability of oxygen atoms for increased Si—O bonding.

As a result, queue time may be reduced when compared to conventional FCVD formation processes as a subsequent curing step may not be necessary to form an FCVD film which exhibits a suitable density and film stress. In addition, reduced film shrinkage compared to conventional FCVD film high temperature annealing processes may be realized by utilizing a lower temperature anneal.

Figure 2:
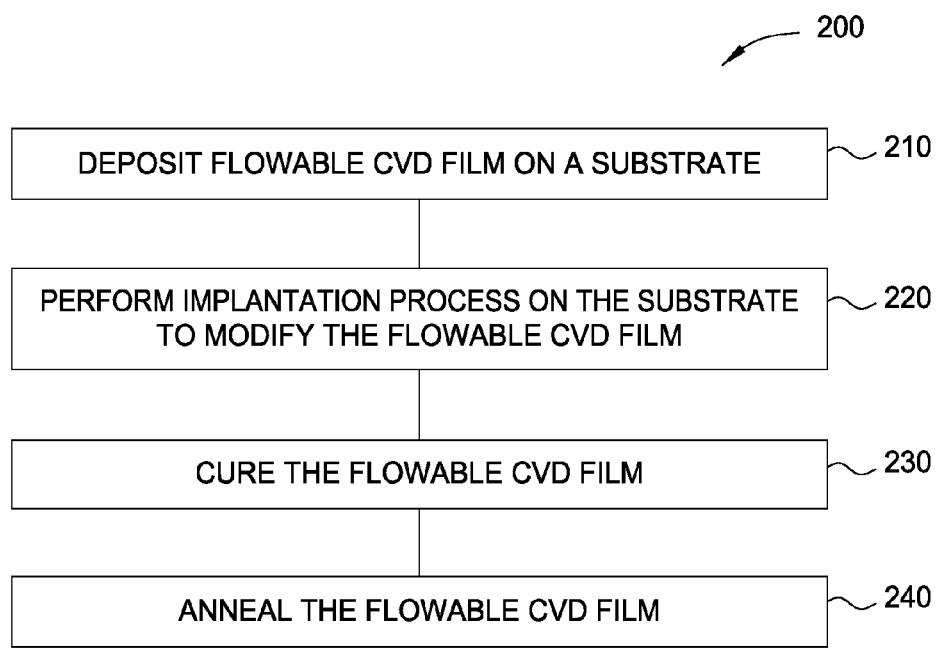
FIG. 2 illustrates operations of a method for forming an FCVD film according to one embodiment described herein.

FIG. 2 illustrates operations of a method 200 for forming an FCVD film. At operation 210, an FCVD film is deposited on a substrate, similar to the process described with regard to operation 110. At operation 220, an ion implantation process is performed on the substrate to modify the FCVD film similar to the process described with regard to operation 120.

At operation 230, the FCVD film may be cured. The FCVD film may be cured subsequent to the deposition and ion implantation operations 210, 220 to remove moisture and residual organics, harden, and densify the layer. The curing is typically performed using low temperature processes at a temperature of about 100 degrees Celsius or less. Such processes include exposure to inductively coupled plasma, ultraviolet light, ozone, e-beam, acidic or basic vapors, an aqueous environment such as heated deionized water, and a combination or succession of such treatments. To facilitate curing, the FCVD film may be heated to a temperature of about 150 degrees Celsius or less by surface heating methods. Such surface heating methods include exposure to infrared or heat lamps and proximity to a hot chamber surface, such as a heated showerhead or the like.

In other embodiments, curing the oxide layer may be performed by heating the substrate using a heat source applied to the surface of the substrate opposite the FCVD film. For example, the substrate may be disposed on a heated substrate support, and curing the FCVD film on the substrate may be performed by heating the substrate support to a temperature between about 100 degrees Celsius and about 150 degrees Celsius. By utilizing relatively low temperatures, thermal budgets of materials on the substrate are not exceeded and undesirable film shrinkage can be avoided.

The FCVD film may be partially cured, if desired, to reduce curing time or to achieve certain desired properties of the cured FCVD film. For example, curing utilizing oxygen radicals derived from ozone may further incorporate oxygen atoms into the FCVD film. It is typically desired that the flowable oxide layer be cured to an extent sufficient to allow a pattern to be formed and maintained by the cured oxide layer without flowing. If curing is expressed as a percentage referring to moisture plus organics remaining in the layer after curing divided by original moisture plus organics, with 0% referring to an uncured layer, such as an as deposited FCVD film, and 100% referring to a layer that has been cured to the extent that all moisture and organics have been removed, the FCVD film is typically cured to at least about 40%, such as between about 50% and about 95%, for example about 90%.

At operation 240, the FCVD film may be annealed similar to the process described in operation 130. In methods 100 and 200, the ion implantation is performed immediately after the FCVD film deposition. The ion implantation functions to break Si—H and Si—N bonds prior to subsequent processing operations which may reduce overall queue time and facilitate oxygen incorporation into the FCVD film in subsequent processing operations.

Figure 3:
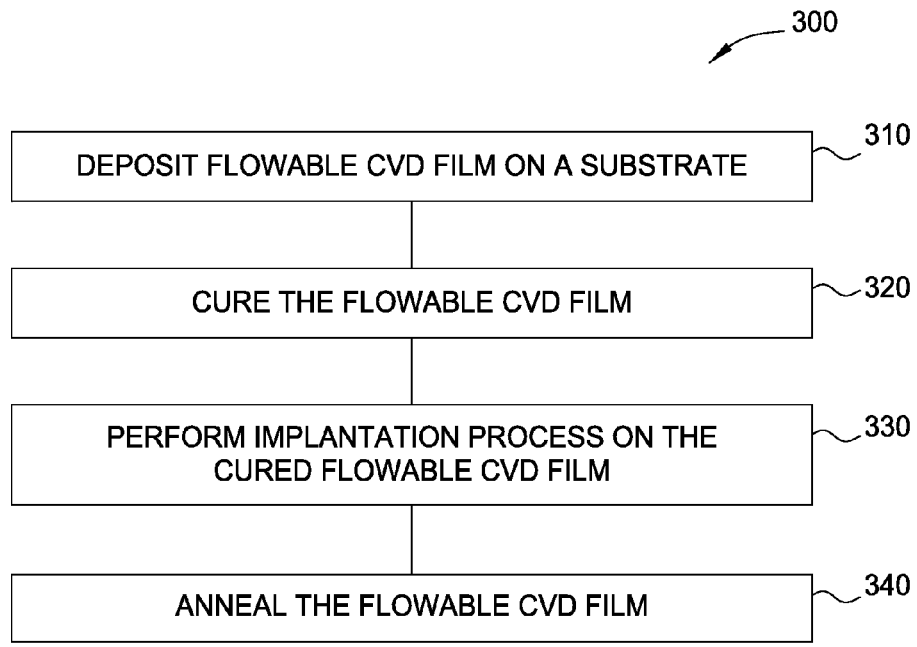
FIG. 3 illustrates operations of a method for forming an FCVD film according to one embodiment described herein.

FIG. 3 illustrates operations of a method 300 for forming a FCVD film. At operation 310, a FCVD film is deposited on a substrate similar to the process described with regard to operation 110. At operation 320, the FCVD film is cured similar to the process described with regard to operation 230. At operation 330, an ion implantation process is performed on the cured FCVD film. The previously cured film may have dangling Si bonds as a result of the curing process and the ion implantation process may further break Si—H and Si—N bonds present in the FCVD film. It is believe the ion implantation may further facilitate outgassing of NH$_x$ materials from the FCVD film and prepare the FCVD film for subsequent SiO$_2$ conversion via oxygen atom incorporation.

At operation 340, the FCVD film is annealed. The annealing process may be a low temperature steam annealing process similar to the process described with regard to operation 130. It is believed that SiO$_2$ material conversion may continue during the annealing process by outgassing NFL materials and by incorporation of oxygen atoms into the FCVD film.

Figure 4:
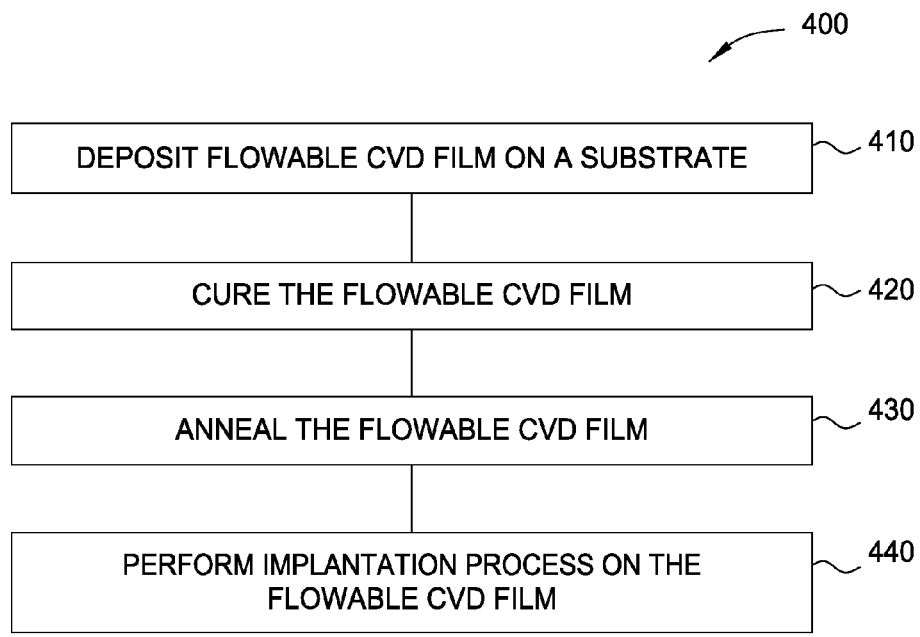
FIG. 4 illustrates operations of a method for forming an FCVD film according to one embodiment described herein.

FIG. 4 illustrates operations of a method 400 for forming a FCVD film. At operation 410, a FCVD film is deposited on a substrate similar to the process described with regard to operation 110. At operation 420, the FCVD film is cured similar to the process described with regard to operation 230. It is believed the curing process facilitates outgassing of undesirable materials from the FCVD film and facilitates incorporation of oxygen atoms into the FCVD film. At operation 430, an annealing process is performed on the FCVD film similar to the process described with regard to operation 130. The annealing process may further incorporate oxygen atoms into the film, for example, by energizing ozone and exposing the FCVD film to oxygen radicals. At operation 440, an ion implantation process is performed on the FCVD film similar to the process described with regard to operation 120. The ion implantation process may accelerate SiO$_2$ conversion of the FCVD film depending upon the ion species utilized in the ion implantation process. Thus, queue time may be reduced when compared to conventional FCVD formation processes.

In certain embodiments, each of the operations in the methods 100, 200, 300, 400 may be performed sequentially. It is believed that the ion implantation operations may result in reduced $SiO_2$ material conversion while providing FCVD films with desirable densities and film stress. For example, it has been found that conventional FCVD films annealed at high temperatures exhibit film stress approximately 30 percent greater than FCVD films formed according to the methods 100, 200, 300, 400. In one example, conventional FCVD films exhibited a film stress of about 200 MPa. FCVD films formed according to the methods 100, 200, 300, 400 exhibited a film stress of about 133 MPa. Accordingly, film stress may be advantageously reduced. It is contemplated that the film stress may also be advantageously influenced by selecting a suitable ion species for implantation and tuning the implantation dosage and implantation energy to form an FCVD film with a reduced film stress, when compared to conventional FCVD films.

Figure 7:
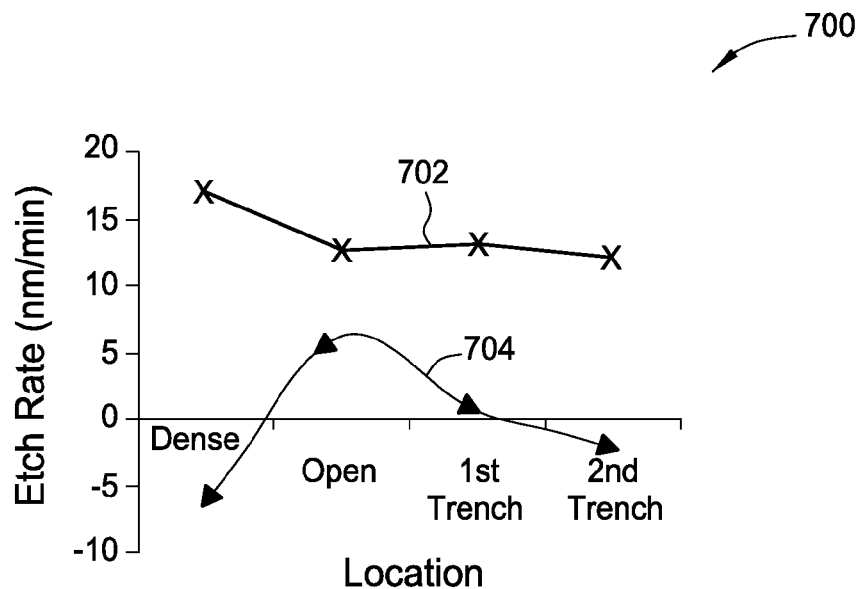
FIG. 7 is a graph illustrating a comparison of etch rates of conventionally formed FCVD films and FCVD films formed according to embodiments described herein.

FIG. 7 is a graph 700 illustrating a comparison of etch rates of conventionally formed FCVD films and FCVD films formed according to embodiments described herein. Data 702 is representative of the etch rate of a conventionally formed FCVD film in diluted HF (100:1). Data 704 is representative of the etch rate of an FCVD film in diluted HF (100:1) formed according to the embodiments described herein. As show, the etch rate of FCVD films formed according to the present embodiments (data 704) is significantly reduced from the etch rate of conventionally formed FCVD films (data 702). The results may indicate an improved density of the improved FCVD films. It is also believed that the improved FCVD films provide for improved film density homogeneity at various locations on the substrate by reducing the loading effect caused by the spatial relationship of adjacent HAR features. For example, the etch rate of the FCVD film at a dense location vs. the second trench location (less dense feature concentration than dense location) is substantially similar which suggests that the loading effect is reduced.

Figure 8:
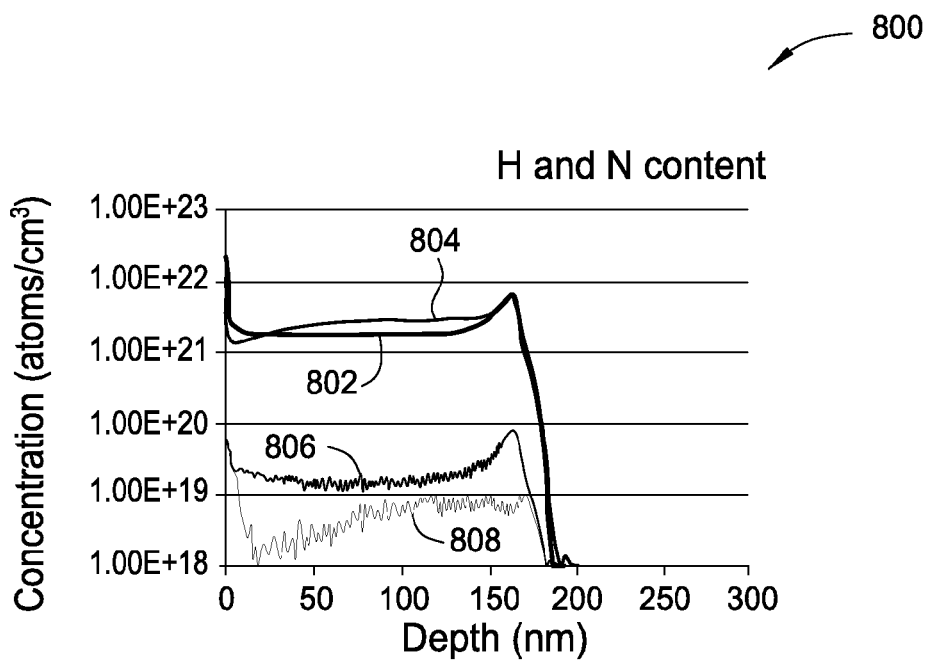
FIG. 8 is a graph illustrating a comparison of hydrogen and nitrogen concentrations of conventionally formed FCVD films and FCVD films formed according to embodiments described herein.

FIG. 8 is a graph 800 illustrating a comparison of hydrogen and nitrogen concentrations of conventionally formed FCVD films and FCVD films formed according to embodiments described herein. Data 802 is representative of the hydrogen content of a conventional FCVD film and data 804 is representative of the hydrogen content of an FCVD film formed according to the embodiments described herein. Specifically, data 804 is representative of an improved FCVD film implanted with hydrogen according to the method 300. It can be seen that the hydrogen content represented by data 804 is similar to the hydrogen content represented by data 802. Surprisingly, hydrogen ion implantation does not appreciably increase the hydrogen content when compared to the conventional FCVD film even though hydrogen ions were implanted into the FCVD film.

Data 806 is representative of the nitrogen content of a conventional FCVD film and data 808 is representative of the nitrogen content of an FCVD film formed according to the embodiments described herein. Specifically, data 808 is representative of an improved FCVD film implanted with hydrogen and nitrogen according to the method 300. It can be seen that the nitrogen content represented by data 808 is about one order of magnitude less than the nitrogen content represented by data 806. Surprisingly, nitrogen ion implantation, in combination with hydrogen implantation, lowers the nitrogen content when compared to the conventional FCVD film even though nitrogen ions were implanted into the FCVD film. A reduced nitrogen concentration in the FCVD film suggests a greater amount of oxygen is incorporated into the film when performing the methods described herein.

In summation, improved FCVD process according to the embodiments described herein provide for reduced queue time which may improve throughput. In addition, a more dense FCVD film may be achieved while processing utilizing temperatures which do not exceed the thermal budget of materials on the substrate. The improved film density generally provides for a reduced etching rate which may improve various etching characteristics. Moreover, film stress, which is tunable utilizing the processes described herein, may be reduced and undesirable film shrinkage may be reduced or eliminated according to the embodiments described herein.

While the foregoing is directed to embodiments of the present disclosure, other and further embodiments of the disclosure may be devised without departing from the basic scope thereof, and the scope thereof is determined by the claims that follow.

What is claimed is:

1. A method for forming a flowable chemical vapor deposition film, sequentially comprising:
   forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr;
   outgassing $NH_x$ materials from the substrate by exposing the dielectric film to oxygen ions in an ion implantation process, wherein x is greater than 0;
   exposing the dielectric film to oxygen radicals to cure the dielectric film; and
   annealing the dielectric film by exposing the dielectric film to water vapor at a temperature less than about 500 degrees Celsius.

2. The method of claim 1, wherein the ion implantation process is performed in-situ in the processing chamber.

3. The method of claim 2, wherein the ion implantation process is performed at a temperature of less than about 500 degrees Celsius.

4. The method of claim 1, wherein the ion implantation process is performed ex-situ in an ion implantation chamber separate from the processing chamber.

5. The method of claim 4, wherein the substrate is transferred from the processing chamber to the ion implantation chamber without breaking vacuum.

6. The method of claim 4, wherein the ion implantation process is performed at a temperature of less than about 500 degrees Celsius.

7. The method of claim 1, wherein the oxygen radicals are formed by exciting an ozone precursor.

8. A method for forming a flowable chemical vapor deposition film, sequentially comprising:
   forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr;
   exposing the dielectric film to oxygen radicals to cure the dielectric film;

outgassing $NH_x$ materials from the substrate by exposing the dielectric film to oxygen ions in an ion implantation process, wherein x is greater than 0; and annealing the dielectric film by exposing the dielectric film to water vapor at a temperature less than about 500 degrees Celsius.

9. The method of claim 8, wherein the ion implantation process is performed in-situ in the processing chamber.

10. The method of claim 9, wherein the ion implantation process is performed at a temperature of less than about 500 degrees Celsius.

11. The method of claim 8, wherein the ion implantation process is performed ex-situ in an ion implantation chamber separate from the processing chamber.

12. The method of claim 11, wherein the substrate is transferred from the processing chamber to the ion implantation chamber without breaking vacuum.

13. The method of claim 12, wherein the ion implantation process is performed at a temperature of less than about 500 degrees Celsius.

14. A method for forming a flowable chemical vapor deposition film, sequentially comprising:

forming a dielectric film on a substrate by reacting a silicon containing precursor, a nitrogen containing precursor, and an oxygen containing precursor in a processing chamber at a temperature of about 100 degrees Celsius or less at a pressure between about 0.5 Torr and about 10 Torr;

exposing the dielectric film to oxygen radicals to cure the dielectric film;

annealing the dielectric film by exposing the dielectric film to water vapor at a temperature less than about 500 degrees Celsius; and outgassing $NH_x$ materials from the substrate by exposing the dielectric film to oxygen ions in an ion implantation process, wherein x is greater than 0.

15. The method of claim 14, wherein the ion implantation process is performed in-situ in the processing chamber.

16. The method of claim 15, wherein the ion implantation process is performed at a temperature of less than about 500 degrees Celsius.

17. The method of claim 14, wherein the ion implantation process is performed ex-situ in an ion implantation chamber separate from the processing chamber.

18. The method of claim 17, wherein the substrate is transferred from the processing chamber to the ion implantation chamber without breaking vacuum.

19. The method of claim 18, wherein the ion implantation process is performed at a temperature of less than about 500 degrees Celsius.

* * * * *